(12) United States Patent
Yerushalmi et al.

(10) Patent No.: US 9,362,122 B2
(45) Date of Patent: Jun. 7, 2016

(54) PROCESS FOR CONTACT DOPING

(75) Inventors: Roie Yerushalmi, Kfar Warburg (IL);
Ori Pinchas-Hazut, Jerusalem (IL)

(73) Assignee: YISSUM RESEARCH DEVELOPMENT COMPANY OF THE HEBREW UNIVERSITY OF JERUSALEM LTD., Jerusalem (IL)

( * ) Notice: Subject to any disclaimer, the term of this patent is extended or adjusted under 35 U.S.C. 154(b) by 0 days.

(21) Appl. No.: 14/004,797

(22) PCT Filed: Apr. 5, 2012

(86) PCT No.: PCT/IL2012/050130
§ 371 (c)(1),
(2), (4) Date: Sep. 12, 2013

(87) PCT Pub. No.: WO2012/137211
PCT Pub. Date: Oct. 11, 2012

(65) Prior Publication Data
US 2014/0011347 A1    Jan. 9, 2014

Related U.S. Application Data

(60) Provisional application No. 61/472,821, filed on Apr. 7, 2011.

(51) Int. Cl.
*H01L 21/22* (2006.01)
*H01L 21/225* (2006.01)
*H01L 21/228* (2006.01)
*H01L 29/06* (2006.01)

(52) U.S. Cl.
CPC .............. *H01L 21/225* (2013.01); *H01L 21/228* (2013.01); *H01L 21/2225* (2013.01); *H01L 21/2251* (2013.01); *H01L 21/2254* (2013.01); *H01L 29/0669* (2013.01)

(58) Field of Classification Search
CPC .............. H01L 21/225; H01L 21/2251; H01L 21/2252; H01L 21/2254; H01L 21/2225; H01L 29/0669
USPC ......................................................... 438/546
See application file for complete search history.

(56) References Cited

U.S. PATENT DOCUMENTS

| 5,871,826 A * | 2/1999 | Mei et al. ...................... 427/596 |
| 6,380,040 B1 * | 4/2002 | Kepler .............. H01L 21/28052 257/E21.165 |
| 2007/0026653 A1 * | 2/2007 | Leu et al. ...................... 438/563 |

FOREIGN PATENT DOCUMENTS

WO    2006/057818 A2    6/2006

OTHER PUBLICATIONS

Ho et al., Controlled nanoscale doping of semiconductors via molecular monolayers—2008, nature materials, vol. 7, pp. 62-67.*
George et al., Surface Chemistry for Molecular Layer Deposition of Organic and Hybrid Organic-Inorganic Polymers—Apr. 2009, Accounts of Chemical Research 498-508, vol. 42, No. 4.*

(Continued)

*Primary Examiner* — Reema Patel
*Assistant Examiner* — Syed Gheyas
(74) *Attorney, Agent, or Firm* — Vorys, Sater, Seymour and Pease LLP

(57) ABSTRACT

Provided is a process for modifying the chemical composition of a surface region of a material, employing rapid thermal processing (RTP) conditions.

18 Claims, 11 Drawing Sheets

(56) References Cited

OTHER PUBLICATIONS

Kalkofen, et al., "Phosphorus diffusion into silicon after vapor phase surface adsorption of phosphine", Materials Science and Engineering B, vol. 124-125, pp. 288-292, (2005).

Yamamoto, et al., "Phosphorus Atomic Layer Doping in Si Using Ph3", Abstract #1958, 218th ECS Meeting, The Electrochemical Society, (2010).

Plaza Castillo, et al., "Very shallow boron junctions in Si by implantation and SOD diffusion obtained by RTP", Microelectronics Journal, vol. 39, pp. 678-681, (2008).

Ho, et al., "Controlled nanoscale doping of semiconductors via molecular monolayers", Nature Materials, vol. 7, pp. 62-67, (2008).

Yerushalmi, et al., "Phosphine Oxide Monolayers on SiO2 Surfaces", Angew. Chem. Int. Ed., vol. 47, pp. 4440-4442, (2008).

Voorthuijzen, et al., "Local Doping of Silicon Using Nanoimprint Lithography and Molecular Monolayers", Adv. Mater., vol. 23, pp. 1346-1350, (2011).

Cho, et al., "Molecular monolayers for conformal, nanoscale doping of InP nanopillar photovoltaics", Appl. Phys. Lett., vol. 98, pp. 203101-1-203101-3, (2011).

Cui, et al., "Diameter-controlled synthesis of single-crystal silicon nanowires", Applied Physics Letters, vol. 78, No. 15, pp. 2214-2216, (2001).

Yerushalmi, et al., "Large scale, highly ordered assembly of nanowire parallel arrays by differential roll printing", Applied Physics Letters, vol. 91, pp. 203104-1-203104-3, (2007).

Fan, et al., "Wafer-Scale Assembly of Highly Ordered Semiconductor Nanowire Arrays by Contact Printing", Nano Letters, vol. 8, No. 1, pp. 20-25, (2008).

Kempa, et al., "Single and Tandem Axial p-i-n. Nanowire Photovoltaic Devices", Nano Letters, vol. 8, No. 10, pp. 3456-3460, (2008).

Tian, et al., "Coaxial silicon nanowires as solar cells and nanoelectronic power sources", Nature Letters, vol. 449, pp. 885-890, (2007).

Gai, et al., "Design of Narrow-Gap TiO2: A Passivated Codoping Approach for Enhanced Photoelectrochemical Activity", PRL, vol. 102, pp. 036402-1-036402-4, (2009).

Ingole, et al., "Ex situ doping of silicon nanowires with boron", Journal of Applied Physics, vol. 103, pp. 104302-1-104302-8, (2008).

Ford, et al., "Monolayer Doping and Diameter-Dependent Electron Mobility Assessment of Nanowires", IC Design and Technology, IEEE Int. Cont, Piscataway, NJ, pp. 223-227, (2009).

Copy of the International Search Report (PCT/ISA/210) for International Application No. PCT/IL2012/050130, three pages, mailed Aug. 14, 2012.

\* cited by examiner

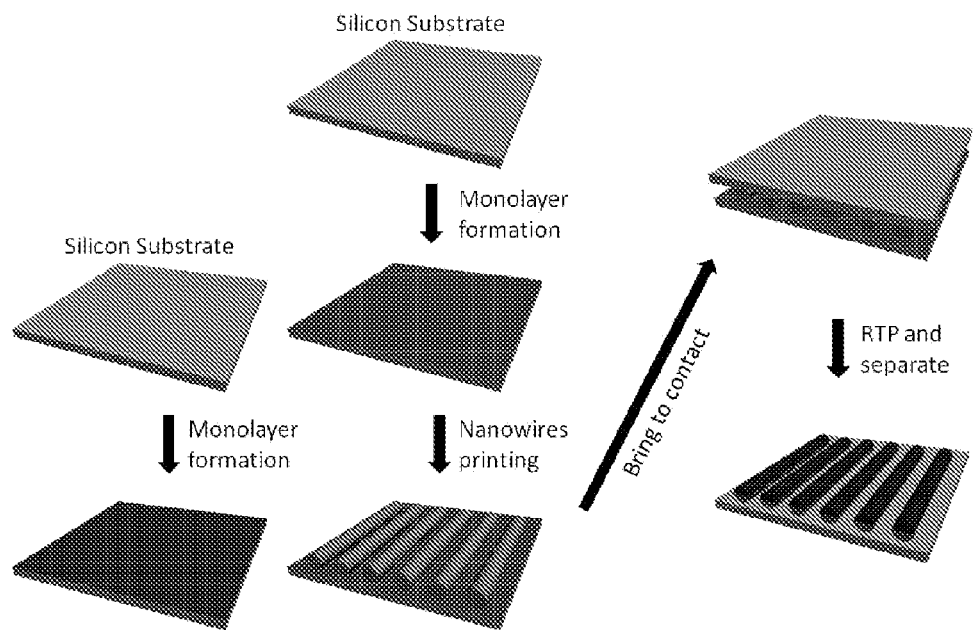
Fig. 7
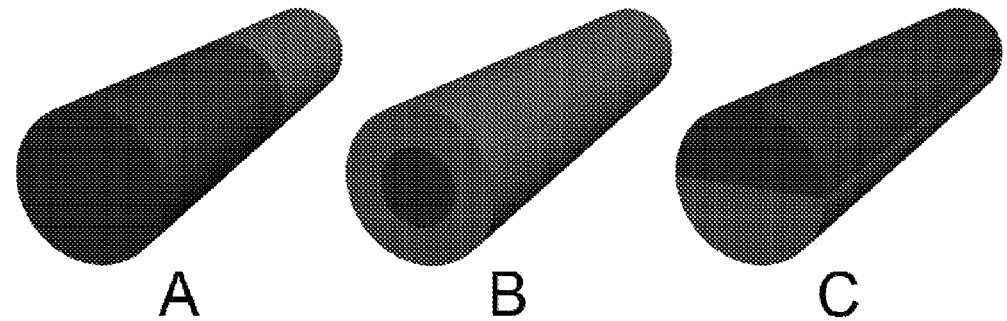
Figs. 8A-C

PROCESS FOR CONTACT DOPING

FIELD OF THE INVENTION

This invention generally relates to a process for doping a material and products thereof.

BACKGROUND

The electrical properties of a semiconductor can be modified by introducing a controlled amount of impurities (dopants) to the semiconductor crystal, enabling the formation of n-type and p-type semiconductor materials.

Most commonly, doping of semiconductors is achieved by diffusion or ion implantation. In ion implantation, a high energy beam of dopant ions is directed at the substrate to be doped. The ions penetrate the semiconductor crystal causing damage and introducing stress to the lattice. Anneal step is required in order to electrically activate the dopants and relaxation of the stresses. The resulting doping depth achieved by this method is usually microns scale.

Alternatively, doping may be achieved by diffusion. In this process, elevated temperature is used to diffuse dopant atoms from gas or solid phase at the surface (spin-on dopant) into the semiconductor. Diffusion process is usually carried out in conventional furnaces for long periods of time, ranging from tens of minutes to hours. These long time periods are required for the thermal stabilization of the furnace due to the large heat capacity. Long diffusion times typically result in diffusion profiles on the scale of microns. For short time processes, Rapid Thermal Processing (RTP) is used. In RTP, high speed heating is achieved by using, e.g., optical radiation, allowing processes on timescale of seconds.

Doping by thin films is a two steps process. First, a thin film of the desired dopant is formed on the surface of the substrate to be doped. This film serves as a dopant source and anneal step is used to diffuse the dopants into the semiconductor by either conventional anneal or RTP. The thin film can be applied by adsorption from vapor phase [1], atomic layer deposition (ALD) [2], or by spin coating to form a thin solid $SiO_2$ film containing the desired dopants (the so-called "spin-on dopant" method, SOD) [3].

Monolayer Doping (MLD) is a method used for ultra shallow doping of Si [4]. In MLD, intrinsic silicon surfaces are reacted to form single molecular layers (monolayers, MLs) having dopant atoms such as boron or phosphorus. Then, a thin layer of silicon dioxide is evaporated on the substrate as a protective capping layer for the diffusion, and thereafter an activation step follows. The RTP process is used to both diffuse the dopants into the semiconductor crystal and electrically activate them.

Prior to monolayer formation, surface activation is required in order to obtain a uniform monolayer on the entire surface. For example, for Si—C covalent bond formation HF treatment is required in order to remove the native $SiO_2$ layer. Hydroxylation is necessary for binding the precursors to the surface, by hydrogen bonding [5]. This is achieved by removing adsorbed contamination and hydroxylation of surface sites.

MLD has been further used for creating patterned doping on silicon by using MLD together with nano imprint lithography [6] and the resulting doping patterns were mapped by TOF-SIMS imaging. Furthermore, MLD was used for sulfur doping of InP nanopillars [7] for the formation of photovoltaic devices.

REFERENCES

[1] Bodo Kalkofen, Marco Lisker, Edmund P. Burte, Phosphorus diffusion into silicon after vapor phase surface adsorption of Phosphine, Materials Science and Engineering B 124-125 288-292 (2005)

[2] Yuji Yamamoto, Klaus Köpke, Junichi Murota and Bernd Tillack, Phosphorus Atomic Layer Doping in Si Using PH3, Abstract #1958, 218th ECS Meeting, The Electrochemical Society (2010)

[3] J. Plaza Castillo, A. Tones Ja'come, O. Malik, N. Tones Lo'pez, Very shallow boron junctions in Si by implantation and SOD diffusion obtained by RTP, Microelectronics Journal 39 678-681(2008)

[4] Johnny C. Ho, Roie Yerushalmi, Zachery A. Jacobson, Zhiyong Fan, Robert L. Alley, Ali Javey, Controlled nanoscale doping of semiconductors via molecular monolayers. Nature Materials, 7, 62-67 (2008)

[5] Roie Yerushalmi, Johnny C. Ho, Zhiyong Fan, and Ali Javey, Phosphine Oxide Monolayers on $SiO_2$ Surfaces. Angew Chem Int Ed, 47, 4440-4442 (2008)

[6] W. Pim Voorthuijzen, M. Deniz Yilmaz, Wouter J. M. Naber, Jurriaan Huskens, and Wilfred G. van der Wiel, Local Doping of Silicon Using Nanoimprint Lithography and Molecular Monolayers, Adv. Mater., 23, 1346-1350 (2011)

[7] Kee Cho, Daniel J. Ruebusch, Min Hyung Lee, Jae Hyun Moon, Alexandra C. Ford, Rehan Kapadia, Kuniharu Takei, Onur Ergen, and Ali Javey, Molecular monolayers for conformal, nanoscale doping of InP nanopillar photovoltaics, Applied Physics Letters 98, 203101 (2011)

[8] Yi Cui, Lincoln J. Lauhon, Mark S. Gudiksen, Jianfang Wang, and Charles M. Lieber, Diameter-controlled synthesis of single-crystal silicon nanowires. Appl. Phys. Lett., Vol. 78, No. 15 (2001)

[9] Roie Yerushalmi, Zachery A. Jacobson, Johnny C. Ho, Zhiyong Fan, and Ali Javey, Large scale, highly ordered assembly of nanowire parallel arrays by differential roll printing. APL, 91, 203104 (2007)

[10] Zhiyong Fan, Johnny C. Ho, Zachery A. Jacobson, Roie Yerushalmi, Robert L. Alley, Haleh Razavi, Ali Javey, Wafer-scale assembly of highly ordered semiconductor nanowire arrays by contact printing. Nano Lett, 8, 20-25 (2008)

[11] Thomas J. Kempa, Bozhi Tian, Dong Rip Kim, Jinsong Hu, Xiaolin Zheng and Charles M. Lieber, Single and Tandem Axial p-i-n Nanowire Photovoltaic Devices. Nano Lett., Vol. 8, No. 10 (2008)

[12] Bozhi Tian, Xiaolin Zheng, Thomas J. Kempa, Ying Fang, Nanfang Yu, Guihua Yu, Jinlin Huang and Charles M. Lieber, Coaxial silicon nanowires as solar cells and nanoelectronic power sources. Nature Vol. 449 October (2007)

[13] Yanqin Gai, Jingbo Li, Shu-Shen Li, Jian-Bai Xia and Su-Huai Wei, Design of Narrow-Gap $TiO_2$: A Passivated Codoping Approach for Enhanced Photoelectrochemical Activity. Physical review letters 102, 036402 (2009)

SUMMARY OF THE INVENTION

The inventors of the invention disclosed herein provide a new approach for controlling (modifying, altering) surface composition of a material, such as a semiconductor material, by contact anneal processing. To achieve efficient implantation of foreign atom(s) in the material surface, molecular entities (in the form of e.g., ligand molecules or salts) comprising the foreign atom(s) to be implanted (incorporated) are either directly associated with the material surface or with a donor surface which, in the process, is brought into direct contact with the material which surface composition is to be altered (modified). Subsequently, implantation of the atom(s)

in the surface of the material is allowed to proceed under conditions of rapid thermal processing (RTP). The process of the invention permits a well controlled ultra-shallow nanometric doping profile.

The term "modifying or altering surface composition" refers to the ability to implant one or more types of atoms (different elements), at various concentrations, or into different depths of the material surface, to thereby change, modify or alter (in general "control") the chemical composition of the material surface region, such that one or more of the herein identified effects are achieved.

The term "foreign atom(s)" refers to one or more types of atoms (ions) which are implanted into the material surface and which may or may not already be contained in said material. The implantation of such foreign atoms may be required for, e.g.:

1. altering one or more of the material electronic properties,
2. increasing the concentration of a certain atom(s) in the material surface,
3. altering one or more of the material's rheological properties,
4. altering one or more of the material's tribological properties,
5. to generally endow the material with a physical or chemical property not previously associated with the material, and/or
6. modify a physical or chemical property of the material.

The implantation of an atom(s) into the material surface is regarded herein as "doping". It should be understood that the term is not limited to doping for the purpose of altering a material's electronic property but rather the term encompasses generally implantation of atom(s) into the material surface for achieving, e.g., any of the above mentioned effects.

The processes of the invention disclosed herein generally relate to modifying, or altering surface composition by implantation into a surface region of a material a plurality of foreign atom(s), as defined herein. The implantation of the foreign atom(s) into a surface region of the material may be controlled both in terms of atom concentration and depth of doping, such that a region of shallow doping, at the region(s) of contact, is obtained. Additionally, the process of the invention permits modifying or altering the surface composition of two or more regions of a material, simultaneously or stepwise; such regions may be spaced-apart regions on the same surface plane or on opposite surface regions.

The "surface region" undergoing doping by the foreign atom(s) is a shallow surface region, generally extending from the most exposed region of the material external surface to a depth of about 1,000 nm. In some embodiments, the shallow surface undergoing doping is a region between about 1 to about 1,000 nm in depth, from the exposed material surface. In further embodiments, the surface region is at a depth of between about 1 to about 30 nm from the exposed material surface. In additional embodiments, the surface region is at a depth of between about 1 to about 10 nm from the exposed material surface.

As used herein, and unless specifically indicated, the "surface region" refers to one or more such regions (spaced apart, patterned or continuous) on a surface of a material.

Depending on the material which composition is to be modified and the foreign atoms to be implanted in the material, doping concentrations may range from about $1 \times 10^{16}$ atoms/cm$^3$ to about 5% dopant atoms (of the total number of material atoms).

In some embodiments, the foreign atoms concentration being between about $1 \times 10^{16}$ atoms per cm$^3$ to about $1 \times 10^{23}$ atoms per cm$^3$. In some embodiments, the number of foreign atom in the doped surface region ranges from about $1 \times 10^{18}$ atoms per cm$^3$ to about $1 \times 10^{22}$ atoms per cm$^3$. In further embodiments, the number of foreign atoms ranges from about $1 \times 10^{19}$ atoms per cm$^3$ to about $1 \times 10^{21}$ atoms per cm$^3$. In additional embodiments, the number of foreign atoms in the material ranges from about $1 \times 10^{19}$ atoms per cm$^3$ to about $1 \times 10^{20}$ atoms per cm$^3$.

In other embodiments, the number of foreign atoms is less than about 10% of the total number of atoms of the material. In other embodiments, the number of foreign atoms is between about 1% and about 10% of the total number of atoms of the material. In further embodiments, the number of foreign atoms is between about 1% and about 5% of the total number of atoms of the material.

In some embodiments, the surface region to be doped is at a depth of between about 1 to about 30 nm or between about 1 and about 10 nm, from the exposed material surface, and the number of foreign atoms in said surface is less than about 10%, or between about 1% and about 10% or between about 1% and about 5% of the total number of atoms of the material.

Thus, in one aspect of the invention, there is provided a process for modifying chemical composition of a surface region of a material, the process comprising:

obtaining a first material and a second material, each of which having a surface region; the surface region of said first material being associated with a plurality of molecular entities (layered) comprising foreign atom(s) (or ions) to be implanted into the surface region of the first material and/or the surface region of the second material; and bringing into contact the surface region of the first material with the surface region of the second material, under rapid thermal processing (RTP) conditions, to permit implantation of said atoms (ions) into the surface region of the first material and/or the surface region of the second material;

thereby modifying the chemical composition of the surface region of either or both the first material or second material.

Under the employed RTP conditions, neither the first material nor the second material disintegrate or undergo decomposition. It should be noted that the second material which is brought into direct contact with the first material, which surface composition is to be altered (modified), is not formed as a layer or coating on top of the first material. Rather, the second material is a separate free material which may be brought into contact with the first material, without needing to be chemically associated therewith, and which contacting may be discontinued without needing chemical striping.

Thus, the contact between the first material and the second material is physical, no adhesion exists between the two materials; thus the contact is physically reversible.

In some embodiments, the first and/or the second material are selected in a non-limiting fashion from materials comprising silicon, tin, boron, tellurium, geranium, gallium and any alloys and materials comprising one or more thereof. Such materials may be selected from gallium arsenide (GaAs), gallium phosphide (GaP), cadmium telluride (CdTe), gallium aluminum arsenide (GaAlAs), indium phosphide (InP), gallium arsenide phosphide (GaAsP), cadmium sulfide (CdS), copper indium gallium diselenide (CIGS), mercury cadmium telluride (HgCdTe), copper indium sulfide or selenide, silicon nitride, silicon germanium, silicon carbide, indium arsenide or any combination thereof.

In some embodiments, the material is selected from a metal oxide, a semiconductor material, a silicon based material and any other material.

In some embodiments, the material is a semiconductor material, being in a form selected from a material coating, a nanoparticle and a nanowire. The semiconductor material may be selected from Si, Ge CdSe, CdS, CdTe, ZnSe, ZnS, ZnTe, HgS, HgSe, HgTe, CdZnSe, ZnO, InAs, InP, InN, GaN, InSb, InAsP, InGaAs, GaAs, GaP, GaSb, AlP, AN, AlAs, AlSb, CdSeTe, ZnCdSe, PbSe, PbTe, PbS, PbSnTe, $Tl_2SnTe_5$, $RuS_2$, $RuO_2$, $MoS_2$, $MoO_3$, $RhS_2$, $RuO_4$, $WS_2$, $WO_2$, $Cu_2S$, $Cu_2Se$, $Cu_2Te$, $CuInS_2$, $CuInSe_2$ and $CuInTe_2$.

In some embodiments, the material is silicon-based. Non-limiting examples of such include silicon nitride, silicon germanium, silicon carbide, or a combination thereof.

In some embodiments, the material is an oxide of an element selected from a metal, non-metal and a transition metal. In some embodiments, the oxide is a metal oxide. In other embodiments, the metal oxide is selected from $TiO_2$, $Fe_2O_3$ and $Al_2O_3$.

In other embodiments, the oxide is of an element selected from Sc, Ti, V, Cr, Mn, Fe, Co, Ni, Cu, Zn, Y, Zr, Nb, Mo, Tc, Ru, Rh, Pd, Ag, Cd, In, Sn, Sb, Te, Hg, Tl, Pb, Bi, and Po, or as a combination of one or more of the listed elements oxides. Non-limiting examples of such include transparent conductive oxides such Sn-doped In oxide (ITO) and fluorine-doped tin oxide (FTO), catalytic and photocatalytic oxides such as $TiO_2$, NiO, and others.

In some embodiments, the first and second materials are the same. In other embodiments, the first material is different from the second material. In further embodiments, one or both of the first and second materials is a silicon-based material.

The material which surface composition is to be modified may be in the form of a substantially two-dimensional material surface, such as a material film or coating, or a patterned material being characterized by one or more three-dimensional features. The material which surface composition is to be modified may be any solid material which, for the purpose of ease of processing, may be layered, coated on or patterned on a substrate (a surface), such that the material is confined to a specific region or a particular pattern.

In some embodiments, either of the first or second material or both materials may be applied on the substrate. The substrate may be any substrate that does not undergo any substantial chemical or physical change or deformation or decomposition under the RTP conditions. Such substrates may be plastic, silicon, glass, quartz, polymeric materials and others. The substrate may be a uniform two-dimensional substrate, the surface of a solid material which may or may not be flat, a large rigid sheet of a solid material, a flexible substrate, a transparent substrate, or a hybrid substrate.

The substrate may be one which already includes a circuit or structural elements that are part of the end device. Such elements may be placed on the substrate prior to the implantation of the process of the invention or thereafter, and may be selected from electrical contacts, wires, conductive paths, conducting elements, optical and/or opto-electrical elements and other three-dimensional elements.

Thus, in some embodiments, the material which surface composition is to be modified (the first material or second material) is coated as a layer or as a coating on at least a region of a substrate, as defined herein.

In some embodiments, the material which surface composition is to be modified is in the form of a plurality of material particulates, of a variety of particulate dimensions and shapes. In some embodiments, the material particulate is selected amongst nanoparticles and nanowires.

As used herein, the term "nanoparticle" or "nanowire" generally refers to any particle (of any shape and composition) or any elongated structure, respectively, characterized by at least one dimension that is in the nano-scale (i.e., between 1 and 1,000 nm or between 1 and 100 nm). Nanoparticles include spherical nanoparticles and nanoparticles of any polyhedral or non-spherical shapes. Nanowires include nanotubes, nanorods and nanoribbons.

The layer of material particulates, e.g., nanowires or nanoparticles, on the substrate may be formed by any one or more methods known in the art. In some embodiments, the method is any one physical or chemical method including immersing the material in a solution comprising said particulates, printing, jet printing, differential roll printing, contact printing, coating, spin coating, or any combination thereof or any other technique enabling such a contact.

In some embodiments, the deposition method is selected from physical vapor deposition (PVD) and chemical vapor deposition (CVD).

In some embodiments, said nanowires are layered on the material surface by printing.

In some embodiments, the material (e.g., particulates) may be layered on a substrate to form a pattern. In other embodiments, the material may be layered on a pre-formed pattern (the pre-formed pattern achievable by a method such as lithography, masking, etching, dry etching, reactive ion etching, wet etching, ink-jet printing, PVD, CVD, or any combinations thereof).

Where nanowires are concerned, the nanowires may be aligned on the substrate as may be required by the desired end result. In some cases, the nanowires may be aligned (e.g., by printing) with the majority of nanowires being substantially parallel to each other or at a certain angel.

In some embodiments of the above process of the invention, one of said first material and second material is a plurality of material particulates (nanoparticles, nanowires as defined herein) layered on a substrate. In some embodiments, the material particulates are nanowires.

In other embodiments, the process further comprising the step of layering on top of the layer of molecular entities a plurality of material particulates, such as nanowires.

As stated above, the first material is associated, chemically or physically (e.g., covalently, ionic interaction, complexation, electrostatic interaction, H-bonding, van der Walls, etc), with a plurality of foreign atoms (ions) through ligand molecules which may be selected amongst organic-inorganic hybrid molecules (ligands), and organic or inorganic salts. Such ligand molecules, when associated each with one or more foreign atom(s), are referred to herein as "molecular entities".

It should be understood that the layer of molecular entities need not be formed (or pre-formed) on the whole surface region of the material. Typically, the layer may be formed to have a desired shape (pattern), a desired thickness (monolayer, bi-layer, film), to be composed of a desired selection of molecular entities and foreign atoms, such that the implantation of the surface region with the foreign atoms will be at the desired region, of the desired shape and atom concentration.

In some embodiments, the molecular entities are in the form of inorganic or organic salts comprising one or more of the foreign atoms (in a charged or neutral state).

Non-limiting examples of molecular entities include 2,4, 6-trimethylphenyl boronic acid (TMPBA), naphthalene-1-boronic acid (NBA1), 2-naphthylboronic acid (NBA2), phenylboronic acid (PBA), dimethylmethylphosphonate (DMMP), tetraethyl methylenediphosphonate (TEMDP), diethyl (2-oxopropyl)phosphonate (DEOPP), tri(4-morpholino)phosphine oxide (TMPO), triphenylphosphine oxide (TPPO), tricyclohexyl phosphine oxide (TCHPO) and diphenylphosphine oxide (DPPO).

In some embodiments, the foreign atoms to be implanted in the material surface region are selected amongst such atoms which presence in the material surface alters the material density of states, causing a change in electrical conductivity, heat conductivity, resistivity, etc.

Thus, in some embodiments, the foreign atoms are selected in reference to the material which surface composition is to be controlled. The atoms may be selected from the so-called p-type dopants and n-type dopants (based on the material in which they are to be implanted).

In some embodiments, the foreign atoms (or ions) may be one or more of Li, Mg, Na, K, Rb, Cs, Be, Ca, Sr, Ba, Sc, Ti, V, Cr, Fe, Ni, Cu, Zn, Y, La, Zr, Nb, Tc, Ru, Mo, Rh, W, Au, Pt, Pd, Ag, Co, Cd, Hf, Ta, Re, Os, Ir, Hg, B, Al, Ga, In, Tl, C, Si, Ge, Sn, Pb, P, As, Sb, Bi, O, S, Se, Te, Po, F, Cl, Br, I and At or any combination thereof.

In some embodiments, the foreign atom is selected from C, B, As, Sb and P.

In some embodiments, the foreign atom is selected from C, B, and P.

In some embodiments, the foreign atom is selected from B and P.

In some embodiments, the foreign atom is B or P and the molecular entity is selected in a non-limiting fashion from 2,4,6-trimethylphenyl boronic acid (TMPBA), naphthalene-1-boronic acid (NBA1), 2-naphthylboronic acid (NBA2), phenylboronic acid (PBA), dimethylmethylphosphonate (DMMP), tetraethyl methylenediphosphonate (TEMDP), diethyl (2-oxopropyl)phosphonate (DEOPP), tri(4-morpholino)phosphine oxide (TMPO), triphenylphosphine oxide (TPPO), tricyclohexyl phosphine oxide (TCHPO) and diphenylphosphine oxide (DPPO).

In some embodiments, the foreign atoms are associated with a surface region of the first material via bifunctional organic ligand molecules, having each at least one atom or group capable of chemical (e.g., through covalent, ionic bonding) or physical (e.g., complexation) association with the surface region of the first material, and at least one other atom or group (which may be the same as the atom or group associating with the surface) capable of association with the foreign atom. The atoms or groups permitting association with the material surface region and with the dopant atoms may be linked through a linking group, being optionally an organic linker.

The molecular entities, as defined herein, are typically reacted with a surface region of the first material to form thereon a layer, or a coat, the shape of which being determined by the shape of the desired region which composition and thus properties are to be controlled. As used herein, the "layer" is generally selected from a monolayer, a bi-layer, a multi-layer, a thin film, a molecular layer or any form of assembly of the molecular entities. It should be understood that in a layer of molecular entities, not all entities must be directly, physically or chemically, associated with the surface. Thus, when the first or any other material is said of " . . . being associated with a plurality of molecular entities . . . " such association encompasses formation of monolayers, as well as bi-layers and multi-layers of any thickness.

The layer may be in the form of a continuous or discontinuous or patterned monolayer.

In some embodiments, the layer covers substantially the whole surface of the material. In other embodiments, a layer is formed only at one or more discrete regions of the material surface. Where the control of a material composition is required in more than one region of the material surface, the layer of molecular entities may be formed simultaneously, or sequentially (step-wise, multistep) prior to applying the RTP conditions on discrete spaced-apart regions of the material surface.

In some embodiments, the layer of molecular entities is formed on a pre-patterned material on a substrate, the pattern being formed as above.

The layer may be constructed in accordance with methods known in the art for forming material layers (coating) on surfaces of particles (e.g., nanoparticles, nanowires) and bulk materials (e.g., flat wafer surfaces).

The formation of the layer of molecular entities may be achieved by any method known in the art. In a typical preparation protocol, the molecular entities are provided in solution, emulsion, ink, or a mixture comprising thereof. Subsequently, the layer is formed by a physical or chemical method such as deposition (e.g., immersing the material in a solution comprising said molecular entities), printing, jet printing, differential roll printing, contact printing, coating, spin coating, or any combination thereof or any other technique enabling such a contact.

The layer of the molecular entities may be instantly formed or may require further treatment steps such as heating, irradiation, drying, vacuuming or any combination thereof.

Prior to application of a layer onto the surface region of the first material, the surface region may be subjected to pre-treatment. Pre-treatment may be selected from etching, heating, putting under vacuum, irradiating, removing contaminations, removing native oxide layer, forming hydrogen-terminated surface (surface hydrogenation), forming hydroxide-terminated surface (surface hydroxylation), exposure to hydrogen gas, sonication, reactive ion etching treatment, UV/Ozon treatment, plasma treatment, $O_2$ plasma treatment, Piranha treatment, cleaning treatment, solution treatment, or any combination thereof.

In some embodiments, the surface pre-treatment may be carried out in solution. Non-limiting examples of such solutions are ammonium hydroxide, hydrogen peroxide, hydrogen chloride, hydrogen fluoride, sulfuric acid, water, or any combination thereof.

In cases where a patterned doping is desired, namely doping of a pre-determined pattern, the molecular entities are layered on the substrate in a pattern.

In some embodiments, the process of the invention comprises:
  obtaining a first material and a second material, each of which having a surface region;
  forming (patterning) a monolayer of molecular entities comprising foreign atoms on a surface region of said first material; and
  contacting the surface region of the first material with a surface region of the second material, under rapid thermal processing (RTP) conditions, to permit implantation of said atoms (ions) into the surface region of the first material and/or the surface region of the second material.

In some embodiments, each of the first material and the second material is a silicon wafer, a patterned monolayer of molecular entities being present on a surface region of one of the wafers. Upon contact with the surface of the other wafer, under RTP, a doped pattern forms on the surface region of the wafer which carried the layer and a doped mirror image pattern on the surface of the other silicon wafer.

In another aspect of the invention, there is provided a process for modifying chemical composition of a pre-formed patterned surface region (e.g., said pre-formed patterned obtained by lithography), the process comprising:
- obtaining a first material and a second material, each of which having a surface region; the surface region of the first material having a pre-formed pattern, said pattern being associated with a plurality of molecular entities comprising foreign atom(s) (or ions) to be implanted into the surface of the patterned region of the first material and/or the surface region of the second material; and
- bringing into contact the patterned region on the surface of the first material with the surface region of the second material, under rapid thermal processing (RTP) conditions, to permit implantation of said atoms (ions) into the patterned surface of the first material to thereby obtain a pattern with a modified composition.

In another aspect of the invention there is provided a process for modifying chemical composition of two or more surface regions of a material with one or more types of foreign atoms, the process comprising:
- obtaining a first material and a second material, each of which having a surface region; the surface region of the first material being associated (chemically or physically) with a plurality of molecular entities comprising foreign atom(s) (or ions) of a first type, to be implanted into the surface region of the first material and/or the surface region of the second material;
- bringing into contact the surface region of the first material with the surface region of the second material, under rapid thermal processing (RTP) conditions, to permit implantation of said atoms (ions) of a first type into the surface region of the first material and/or the surface region of the second material;
- coating a further surface region (undoped region) of the doped first material or a surface region of the second or another material with a layer of molecular entities comprising foreign atom(s) (or ions) of a second type; and
- bringing into contact said different surface region of the first material with the surface of the second or another material, under rapid thermal processing (RTP) conditions, to permit implantation of said further surface region with the foreign atoms of the second type,
- optionally repeating the above steps as may be desired to thereby obtain a material surface implanted at two different regions with one or more atom types (ions).

Subsequent to the application of the RTP conditions to permit implantation of atoms (ions) of a first type into the surface region of the first material and/or the surface region of the second material, and prior to the coating of a further surface region (undoped region) of the doped first material with a layer of molecular entities comprising foreign atom(s) (or ions) of a second type, the contact between the two materials is discontinued, permitting the step of coating.

The process steps may be repeated to enable implantation of foreign atoms into further regions of the material.

In some embodiments, the atoms of the first type and the atoms of the second type are identical.

The implantation of one or more types of foreign atoms into two or more surface regions of the material, may proceed step-wise, as above, or may be achieved by forming the layer of molecular entities on the two or more surface regions (continuous or spaced-apart) of the first material and thereafter contacting the two or more surface regions at the same time with a second material, or with two or more other materials, under RTP conditions. The foreign atoms may or may not be the same.

Thus, the process for modifying chemical composition of two or more surface regions of a material with one or more types of foreign atoms may alternatively comprise:
- obtaining a first material and a second material, each of which having a surface region; two or more surface region of the first material being associated (chemically or physically) with a plurality of molecular entities comprising foreign atom(s) (or ions) of one or more type, to be implanted into the surface region of the first material and/or the surface region of the second material;
- bringing into contact the two or more surface regions of the first material with one or more surface regions of the second material, under rapid thermal processing (RTP) conditions, to permit simultaneous implantation of said atoms (ions) of one or more types into the surface regions of the first material and/or the surface regions of the second material;
- to thereby obtain a material surface implanted at two or more surface regions with the same or different atom types (ions).

Each of the two or more regions may be implanted with the same or different atoms.

Thus, the process permits sequential or simultaneous doping of a material, at two or more of the material surface regions, with a plurality of foreign atoms, at varying concentrations, and at varying implantation (incorporation) depths. This process permits the production of a doped material having a plurality of doped regions, each doped with atoms of a different or same type, and potentially each being at a different depth within the surface region. For example, one region of a material may be n-type and another region may be p-type. In another example, a region of a material is doped with atoms of one dopant material at a certain concentration, and thereafter doped with atoms of a second or further material at a smaller or greater concentration.

The process of the invention further permits the construction of bipolar devices having at least one n-type region and at least one p-type region. The n-type region and the p-type regions may be separated from one another by an undoped (or intrinsic) region. The n-type and p-type regions may be coaxial or positioned longitudinally or axially.

The invention also provides a process for implantation of a single region of a material with two or more types of foreign atoms, the process comprising:
- obtaining a first material and a second material, each of which having a surface region; the surface region of the first material being associated (chemically or physically) with a plurality of molecular entities comprising foreign atom(s) (or ions) of a first type, to be implanted into the surface region of the first material and/or the surface region of the second material;
- bringing into contact the surface region of the first material with the surface region of the second material, under rapid thermal processing (RTP) conditions, to permit implantation of said atoms (ions) of a first type into the surface region of the first material and/or the surface region of the second material;
- coating the doped surface region of the first material or a surface region of a further material with a monolayer of molecular entities comprising foreign atom(s) (or ions) of a second type; and
- bringing into contact said doped surface region of the first material with the surface of the further material, under rapid thermal processing (RTP) conditions, to permit implantation of said doped surface region with the foreign atoms of the second type, to thereby implement the same surface region of the material with two or more atom types (ions).

In some embodiments, the two or more atom types are different or same.

Subsequent to the application of the RTP conditions to permit implantation of the atoms (ions) of a first type into the surface region of the first material and/or the surface region of the second material, and prior to the coating of the doped surface region of the first material with a layer of molecular entities comprising foreign atom(s) (or ions) of a second type, the contact between the two materials is discontinued, permitting the step of coating.

In some embodiments, the process steps are repeated to enable implantation of further ($3^{rd}$, $4^{th}$, etc) types of foreign atoms.

In some embodiments, the first material and the second material are each silicon wafers, one of which being coated or patterned with a plurality of molecular entities.

In some embodiments, the concentration of molecular entities comprising atoms of a first type in the formed layer on the first material is different from the concentration of molecular entities comprising atoms of the second type, thus permitting doping of the two different atoms at different concentrations.

In some embodiments, the RTP conditions for implanting the atoms of the first type are applied for a period of time longer or shorter then the period of time for implanting the atoms of the second type, to thereby allow implantation of the atoms of the first type deeper or more shallow, respectively, as compared to the doping depth of the atoms of the second type.

The invention also provides a process for modifying surface chemical composition of at least one surface region of a nanowire with at least one type of foreign atoms, the process comprising:

obtaining a plurality of nanowires layered on a substrate, said nanowires having an exposed surface region capable of coming into contact with a surface region of a second material; said surface region of the nanowires or of the second material being associated with a layer of molecular entities comprising foreign atom(s) (ions) of a first type;

bringing into contact said surface region of the nanowires with the surface region of the said second material, under rapid thermal processing (RTP) conditions, to permit doping of the nanowire surface region with said foreign atoms of a first type;

coating a different region of the surface of said nanowires or of a further material with a layer of molecular entities comprising foreign atom(s) (ions) of a second type; and bringing into contact said different region with said further material under rapid thermal processing (RTP) conditions, to permit implantation of said different region with foreign atoms of a second type.

This process of the invention may be repeated to afford nanowires having multiple regions of different compositions.

Subsequent to the application of the RTP conditions to permit implantation of the atoms (ions) of a first type into the surface region of the nanowires, and prior to the coating of the different surface region of the nanowires with a layer of molecular entities comprising foreign atom(s) (or ions) of a second type, the contact between the nanowires and the second material is discontinued, permitting the step of coating.

In some embodiments, the substrate layered with a plurality of nanowires (or particulates) is prepared as follows:

obtaining a substrate with a layer of molecular entities comprising foreign atom(s) (ions) to be implanted in the nanowires surface; and layering the nanowires on a surface region of said substrate, optionally under conditions of rapid thermal processing (RTP).

If RTP conditions are applied, implantation of the foreign atoms into the surface of the nanowires being in contact with the substrate is achieved. However, in some cases, where doping of the opposite surface of the nanowires is also desired, by the same or different foreign atoms, the RTP conditions may be applied only when the second or further material (e.g., flat substrate such as a wafer) is applied on the opposite surface. Thus, the process comprises:

obtaining a substrate with a layer of molecular entities comprising foreign atom(s) (ions) of a first type to be implanted in a nanowires surface;

layering nanowires on a surface region of said substrate covered with said layer, coating said nanowires or a surface region of a second material with a layer of molecular entities comprising foreign atom(s) (ions) of a second type; and bringing into contact said nanowires (on the substrate) with the surface region of the said second material, under rapid thermal processing (RTP) conditions, to permit doping of the nanowire surface regions with said foreign atoms of a first and second types.

As depicted in FIG. 7, the nanowires are doped while sandwiched between the two material surfaces.

In some embodiments, the atoms of the first and second types are the same, thereby enabling circumferential doping of nanowires. In some embodiments, the two types of atoms are different, thereby allowing longitudinal doping of nanowires.

This process of the invention thus provides the means to construct bipolar nanowires having one region doped with p-type dopant atoms and another region doped with n-type dopant atoms. The region(s) between the two doped regions may be undoped (or intrinsic). Thus, the invention also provides a doped p-n or p-i-n nanowires junctions, or any other junction structure (such as, p-n-p, n-p-n, $p^+$-n-$p^+$) along a single nanowires.

In some embodiments, the nanowires are doped differently in different regions (segments) of the nanowires, positioned axially, co-axially or along said nanowire.

The processes of the invention are carried out under conditions of rapid thermal processing (RTP). During this process, the two materials, typically layered or coated or in the form of flat material surfaces, are brought into contact by placing them face-to-face, namely in such a way that the surface regions are in a direct and full contact with each other. For the purpose of achieving doping, a force need not be applied to the two materials during the RTP process. Thermal radiation or heat (by using furnaces or lamps) is applied to the two materials while in contact, typically under vacuum. It should be noted that under the condition of RTP neither the first material nor the second material undergoes decomposition or phase change. While both the first and second materials remain intact under the RTP conditions, the molecular entities comprising the foreign atoms undergo dissociation and fragmentation.

Thermal radiation or heat is used to rapidly heat a substrate, in a controlled environment, to a temperature at which the molecular entities are disintegrated (decomposed) allowing the foreign atoms to be implanted into the material surface. The annealing temperature is maintained for a very short time period, e.g., less than one second to several minutes (from 0.01 sec to 25 minutes), depending on the process and process materials. The temperature is then reduced to room temperature for further processing.

Once the thermal treatment is discontinued, the two materials are separated from each other and may subsequently be further treated to permit further doping of the same or different regions, in accordance with the present invention.

In some embodiments, the temperature utilized in the RTP is within the range of 50° C. to 1,200° C. In other embodiments, the temperature is between 500° C. to 1,200° C. In further embodiments, the temperature is within the range of 700° C. to 1,200° C. In yet other embodiments, the temperature is within the range of 700° C. to 1,000° C.

In other embodiments, the temperature is above 700° C.

In further embodiments, the temperature is within the range of 50° C. to 500° C. In yet other embodiments, the temperature is within the range of 70° C. to 400° C.

In some embodiments, the thermal treatment is preformed under vacuum. In some embodiments, the process is carried out in the range of $1\times10^{-3}$ mbar to atmospheric pressure, under ambient gas flow such as Ar or $N_2$. In some embodiments, the pressure is lower than $1\times10^{-3}$ mbar.

In some embodiments, the thermal treatment is performed at 1,005° C. and at a pressure lower than $1\times10^{-3}$ mbar.

The RTP method as used in accordance with the invention enables control of the dopant profile, as well as obtaining well defined dopant regions, ultra-sallow doping, heterogenic doping profiles at the nanoscale. Typically, the longer the RTP conditions are applied, the deeper the doping.

In another aspect of the invention, there is provided a doped material obtainable (obtained) by any one or more of the process of the invention.

The process of the invention is suitable for application in electrical systems, optical systems, consumer electronics, industrial electronics, wireless systems, space applications, and many other applications.

In some embodiments, the process of the invention may be used for constructing a field effect transistor (FET) on an active device area of a device substrate, process comprising the step of implanting atoms of at least one type into at least source and drain regions of a material to form source and drain contact junctions.

In some embodiments, the process of the invention is used for producing reinforced materials such as mechanical elements, such as cutting tools, automotive parts, hardware (building) materials and others.

In some embodiments, the process of the invention is used for producing heating elements and thermal insulators.

In some embodiments, the process of the invention is used for producing catalytic materials.

In a further aspect, the invention provides a device, obtainable by the process of the invention.

In some embodiments, the device is an electronic device (transistor, diode) in a form selected from n-p-n, p-n-p and n-i-p.

In some embodiments, the device is selected from a diode; a transistor; an electronic circuit component; an integrated circuit; a detector; a switch; an amplifier; a transducer; a laser; a tag; a photoconductor; a photodiode; a photovoltaic cell; a light emitting diode (LED); a light sensor; a display; and a large area display array.

A kit (industrial package) for permitting doping of a material with at least one type of material atoms, the kit comprising:
1. a first material;
2. a second material;
one of said first and second materials being associated on at least a surface region thereof with a plurality of molecular entities comprising foreign atom(s) (or ions) to be implanted into the surface region of the first material and/or second material; and
3. instructions for directing the user to bring in contact said first and second materials under condition of RTP.

In some embodiments, said first material and said second material are each layered on a substrate. In some embodiments, each of said materials being the surface material of a different substrate.

In some embodiments, one of said first material and said second material is in the form of particulates, e.g., nanowires or nanoparticles.

In further embodiments, the first and second materials are silicon wafers.

In additional embodiments, the first material and second material are provided in contact such that the surface of one of said materials being associated on at least a region thereof with a plurality of molecular entities is maintained in contact with a surface region of the other material.

In some embodiments, the first and second materials are non-particulate materials.

BRIEF DESCRIPTION OF THE DRAWINGS

In order to understand the disclosure and to see how it may be carried out in practice, embodiments will now be described, by way of non-limiting example only, with reference to the accompanying drawings, in which:

FIG. 7 depicts a process scheme for the fabrication of vertical nanowire based p-n junction.

FIGS. 8A-8C depict three different p-n nanowire structures: axial (FIG. 8A), co-axial (FIG. 8B) and vertical (longitudal) (FIG. 8C).

DETAILED DESCRIPTION OF EMBODIMENTS

The invention disclosed herein (Monolayer Contact Doping, MLCD), extends the capabilities of the Monolayer Doping, MLD, known in the art.

Figure 1:
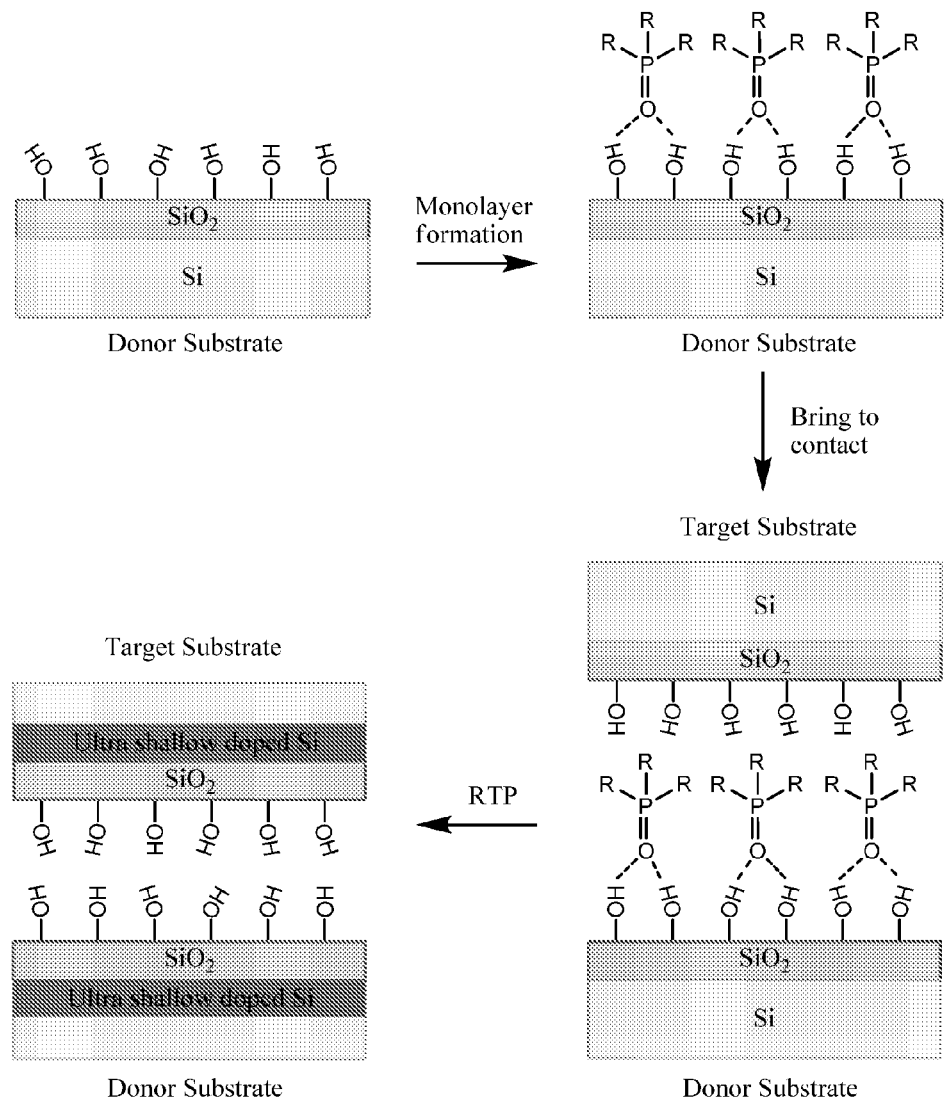
FIG. 1 is a general depiction of the MLCD process of the invention.

As generally illustrated in FIG. 1, a donor material associated with a plurality of molecular entities comprising each the foreign atom(s) to be implanted is brought into contact with a target material, e.g., a pristine substrate, under conditions of rapid thermal processing (RTP). Implantation (doping) of the foreign atoms in the surface of the target material is subsequently achieved. As demonstrated herein, the foreign atom(s) may be implanted in the surface of both the donor material and the acceptor material.

As used herein, for the purpose of brevity, the surface being associated with the molecular entities comprising the atom(s) to be implanted in the surface is termed a "donor" and the material to be implanted with the foreign atoms is herein referred to as the "acceptor".

Figure 2:
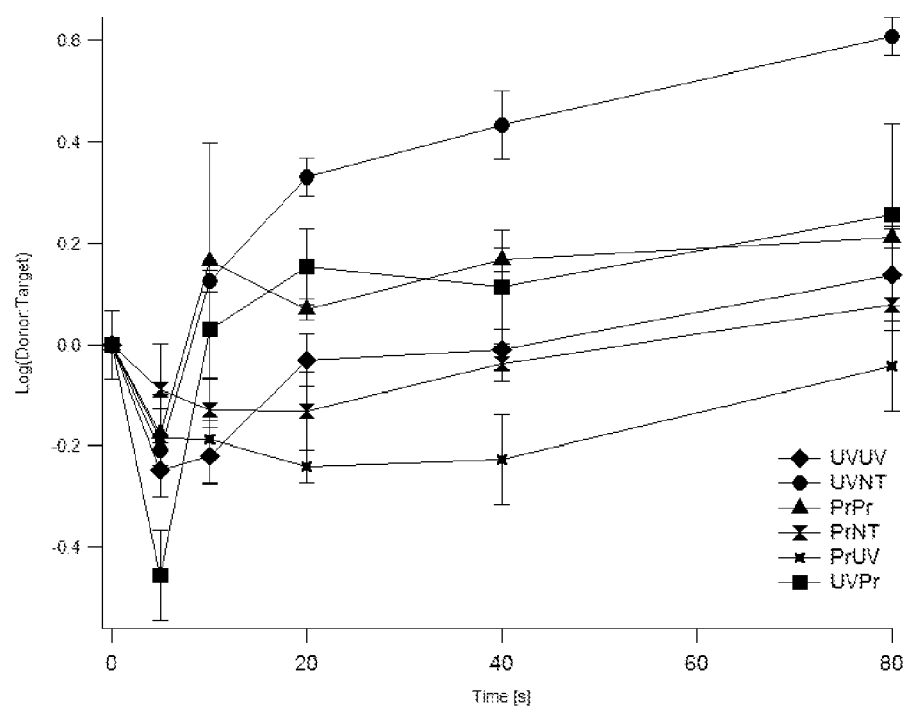
FIG. 2 is a plot of donor:target sheet resistance ratio for different surface activation methods, employing MLCD at 1005° C. using TEMDP precursor.

Surface activation can be accomplished by oxygen plasma, UV\Ozone cleaning or Piranha cleaning solution. Each of these surface treatments has different effects on the surface. The inventors of the present application have found that each of these treatments also result in significant modulation of the final doping process. This influence of the different treatments is shown in FIG. 2 as the ratio between sheet resistance of the donor and target substrates after different surface treatments prior to the MLCD process. All samples were doped by a monolayer of tetraethyl methylenediphosphonate (TEMDP) and RTP at 1,005° C., under vacuum.

The use of different surface treatments allows the control on the doping contrast between donor and target substrates. Using the same surface treatment for both donor and target substrates results in equal doping for both substrates. MLCD made possible the use of different treatments, hence getting different doping levels for donor and target substrates. In FIG. 2 traces names format is XXYY, where XX is the surface treatment used for the donor substrate prior to monolayer formation, YY is the treatment used for the target substrate. For example: UVNT means donor substrate was treated with UVOCS (UV\Ozone cleaning) and target substrate was untreated. UV=UVOCS, Pr=Piranha, NT=untreated. A positive value means the target substrate is doped more than the donor substrate and vice versa.

Figure 3A:
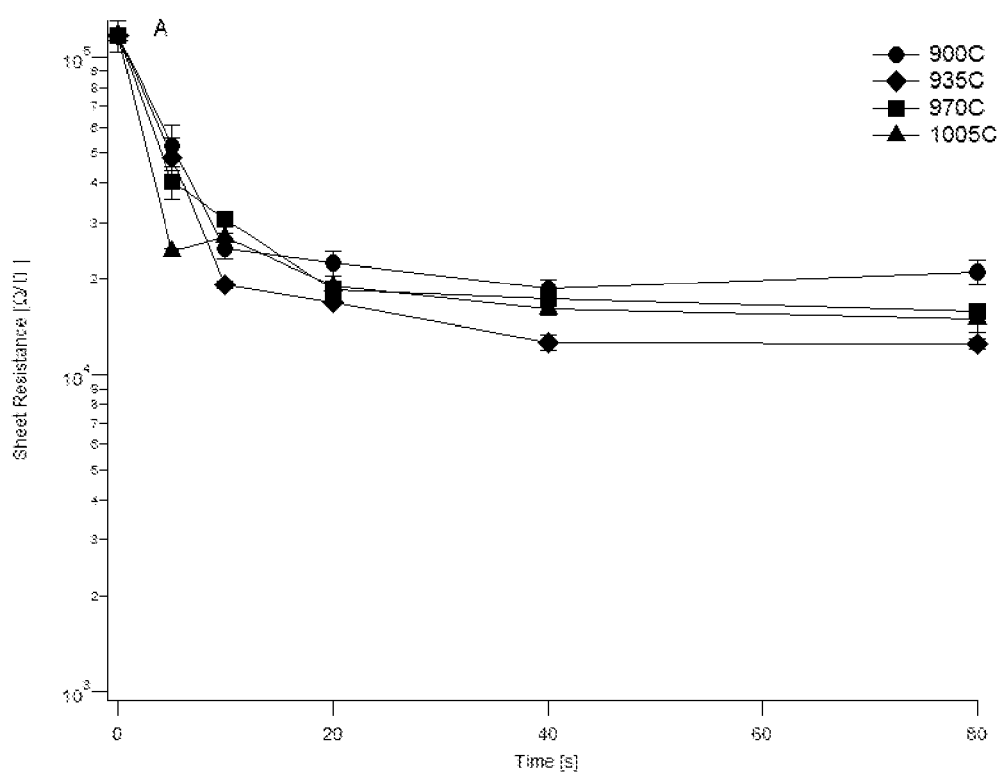
FIGS. 3A-3B are plots of sheet resistance as a function of RTP time and temperature for donor (FIG. 3A) and target (FIG. 3B) substrate doped by MLCD process with a TEMDP precursor.
Figure 3B:
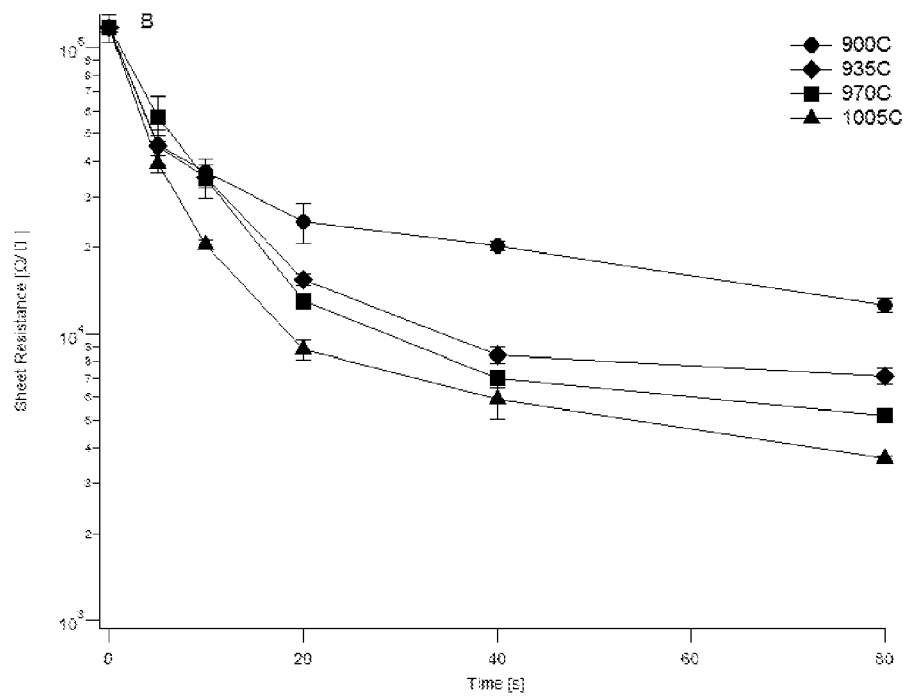

Results of sheet resistance measurements versus time at different temperature are presented in FIG. 3. These were measured for samples doped using TEMDP monolayer after UV\Ozone treatment for the donor substrate and untreated target substrates. The trends shown in FIG. 3 for the untreated target substrate match expected trends. For the donor substrate a reduced dependence on temperature is observed, this is considered to be related to the UV\Ozone cleaning treatment.

Figure 4A:
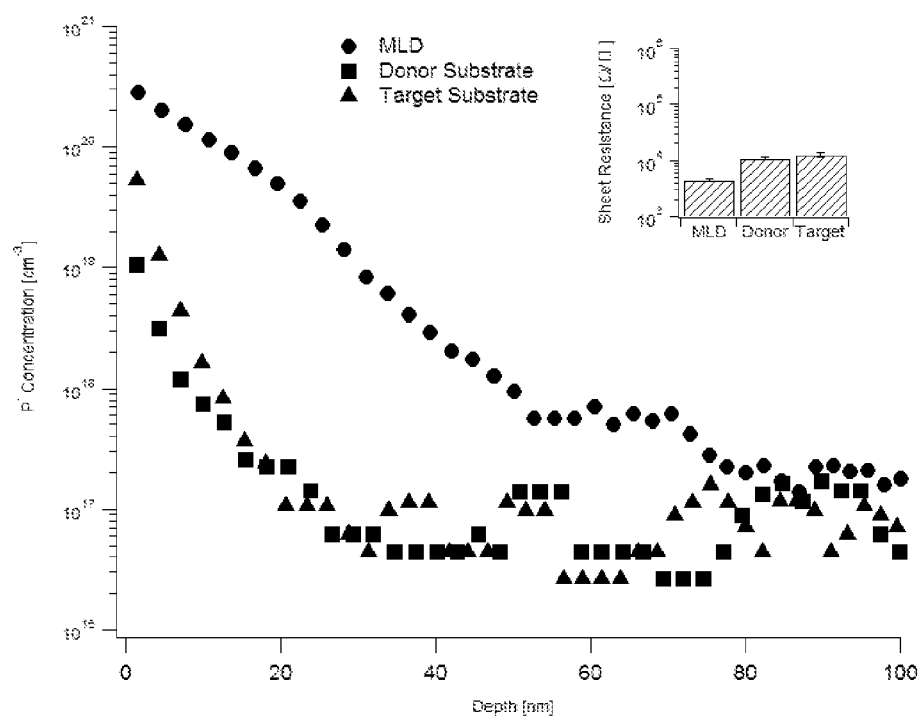
FIGS. 4A-4B are plots of TOF-SIMS measurements of phosphorus samples (FIG. 4A) doped by TEMDP and boron samples (FIG. 4B) doped by PBA. Inset: corresponding sheet resistance measurements.
Figure 4B:
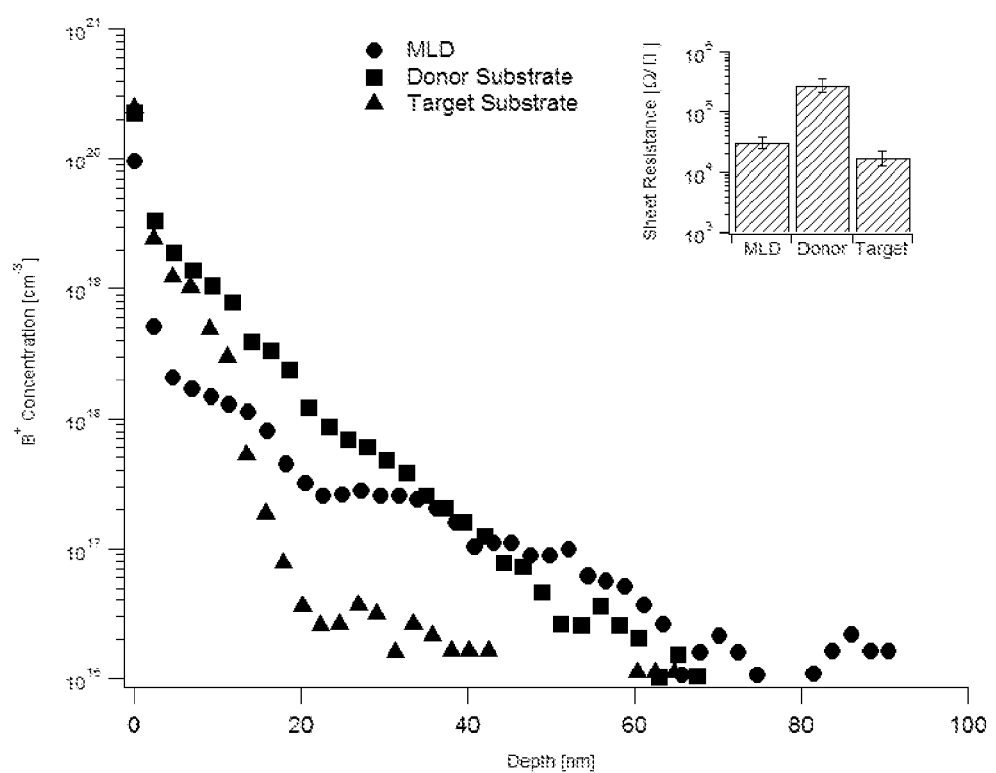

Dopant concentration profiles were measured by TOF-SIMS. FIG. 4 presents results of the TOF-SIMS measurements for samples doped by a monolayer of TEMDP and phenylboronic acid (PBA). For both donor substrates UV\Ozone cleaning was used for surface activation and target substrates were untreated. RTP was done at 970° C. for 20 seconds.

Figure 5A:
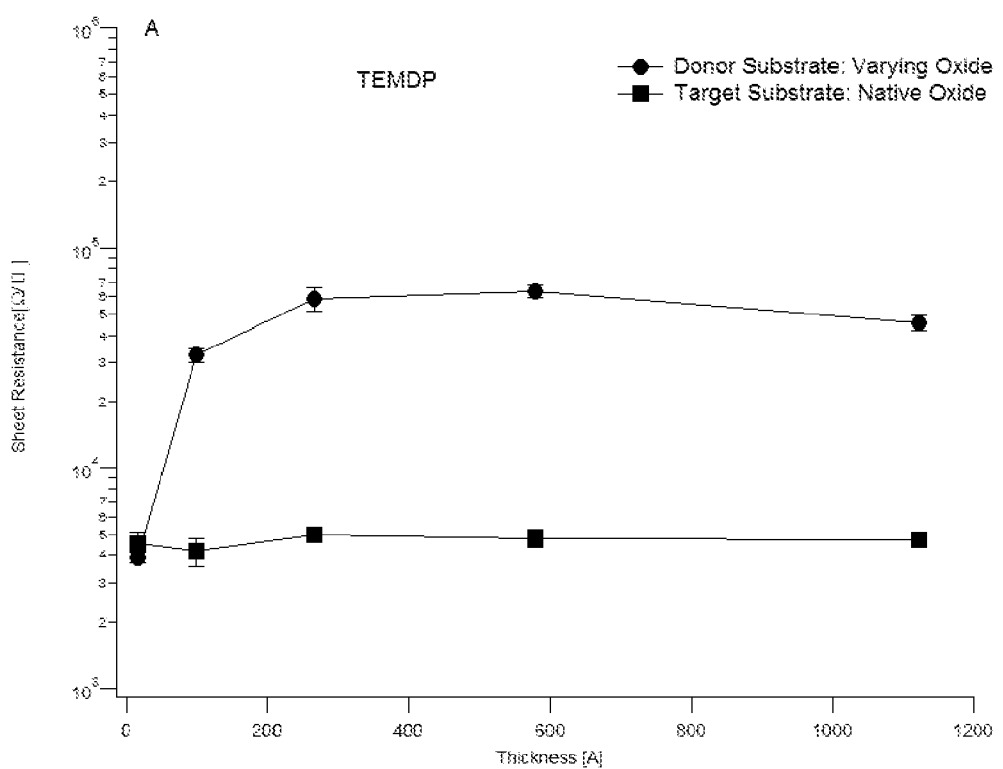
FIGS. 5A-5C are plots of sheet resistance of donor and target substrates for different oxide thicknesses on the donor substrate for target substrate with and without an oxide layer, using TEMDP precursor (FIG. 5A) and DPPO (FIGS. 5B, 5C).
Figure 5B:
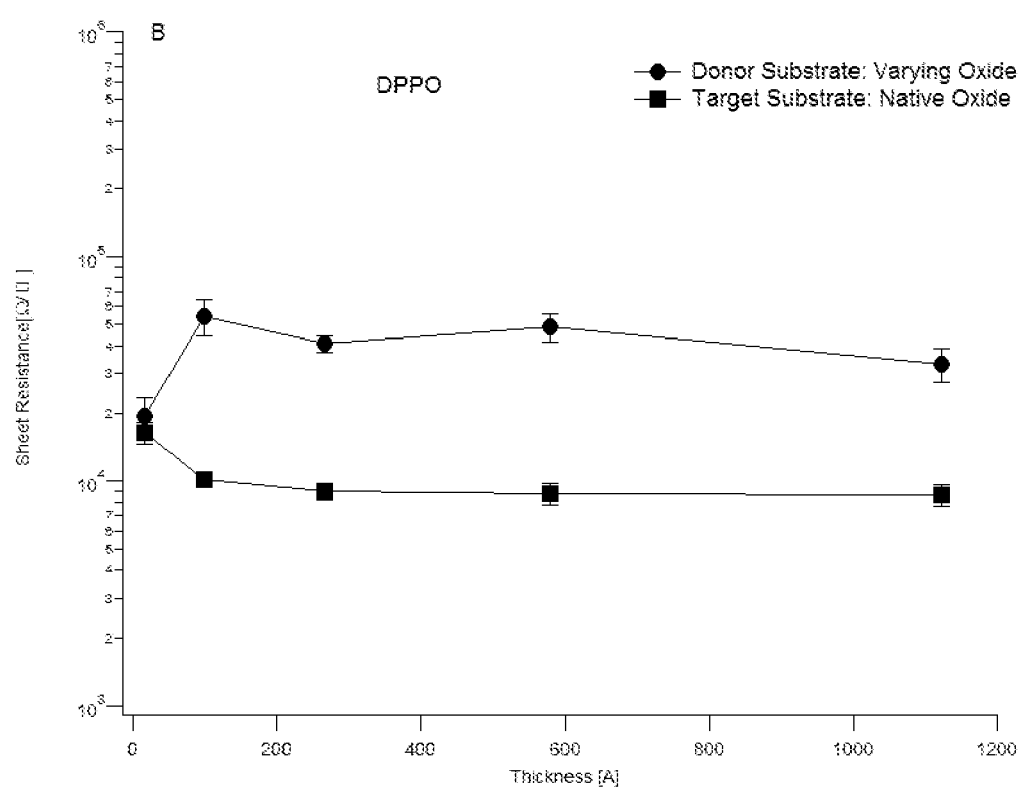
Figure 5C:
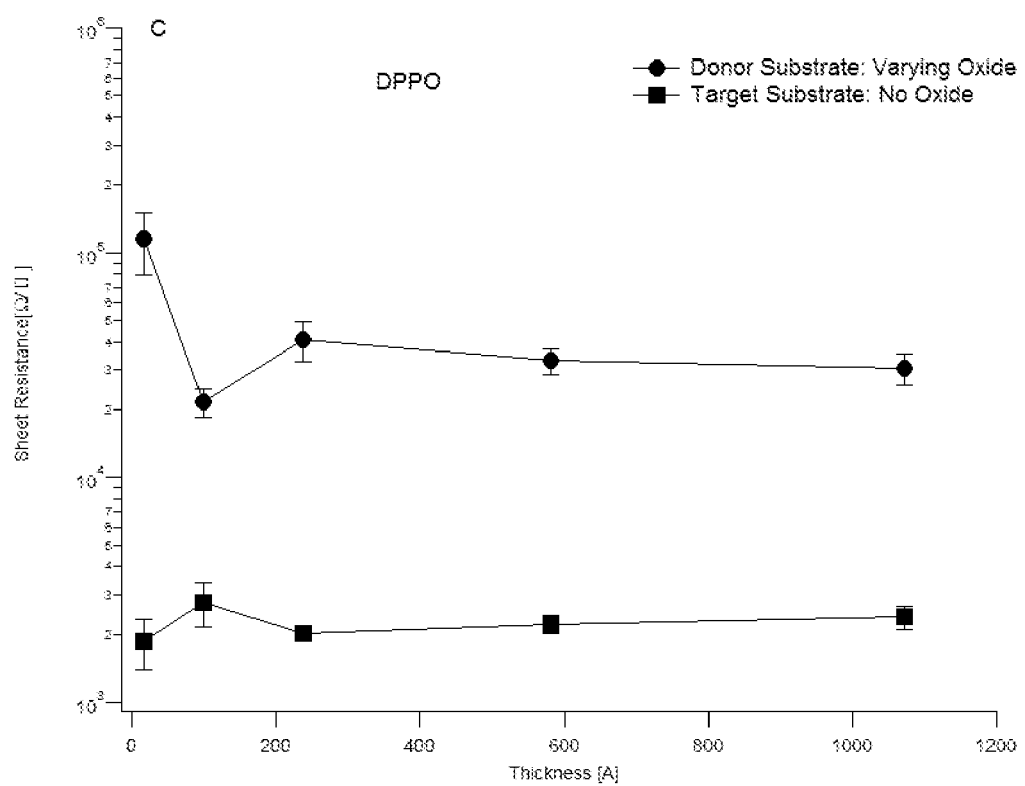

The role of the oxide in the process was examined by using dry thermal oxidation for the formation of thicker oxide layers on the intrinsic Si substrates. These substrates were used as a donor substrate for MLCD process using diphenylphosphine oxide (DPPO) monolayer. The target substrate in these processes was either with native oxide or without oxide (after removal by HF solution). The results of these processes are shown in FIG. 5. For the thinner oxides it can seen that the oxide is barrier for the dopants diffusion, but for the thicker oxides (>100 nm thick) doping of the semiconductor is still achieved. This indicates that the oxide serves both as a barrier for the diffusion as well as a buffer layer for the dopants. In addition, comparing the DPPO results on native oxide target substrate results to TEMDP native oxide target substrate demonstrate the role of surface chemistry in controlling the resulting doping level. When using TEMDP as a dopant precursor a higher doping level is achieved. This is due to higher dopant dose per area for a monolayer of TEMDP compared to DPPO.

Figures 6A, 6B:
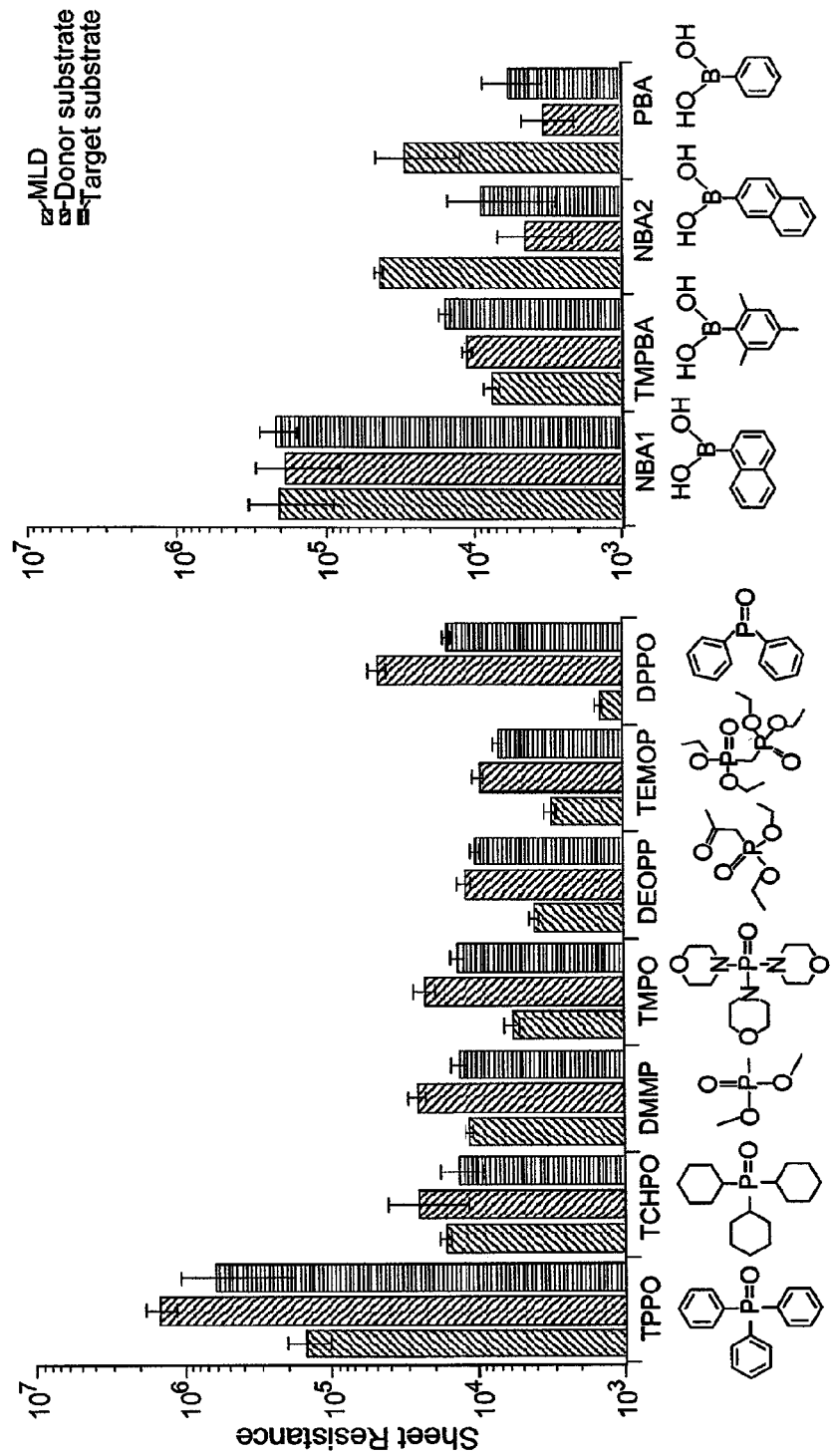
FIGS. 6A-6B are bar diagrams of sheet resistance values for different precursors of P (FIG. 6A) and B (FIG. 6B).

Similarly to the MLD method, MLCD can be applied to various dopant precursors. This allows the introduction of different dopant such as phosphorous, arsenic, antimony and boron, for both n-type and p-type doping capabilities. By using other precursors it is possible to change molecular details like carbon content and molecular footprint. Sheet resistance measurements of samples doped by different phosphorus and boron precursors are presented in FIG. 6. Other than using different precursors for doping with various dopants, doping level can be controlled via molecular details such as molecular footprint, precursor stability, surface bonding and precursor-precursor interaction.

Using MLCD of the Invention for the Fabrication of Nanowire Based Photovoltaics

Nanometric p-n junctions are created in silicon nanowires arrays by using the MLCD method. Silicon nanowires are synthesized in a Chemical Vapor Deposition (CVD) system by using the Vapor-Liquid-Solid (VLS) growth mechanism [8]. The nanowires are then printed on a substrate with a pre-formed monolayer to create a parallel nanowires array [9,10] on top of the dopant bearing monolayer. Another substrate is reacted to form an opposite dopant monolayer than brought to contact with the nanowires array. RTP process is used for diffusion of the dopant into the crystalline nanowires.

The expected vertical all-crystalline-nanowire p-n junctions are predicted to show improved properties as a photovoltaic nanometric device in comparison to previously demonstrated p-n nanowires. In the case of the previously demonstrated axial p-n silicon nanowires structure [11] as well as coaxial structure p-n junction nanowire [12] (FIGS. 8A and 8B). The previously demonstrated axial p-n silicon nanowires structure is achieved by adding dopants to the nanowires during synthesis in the CVD process.

Charge separation in photovoltaic devices takes place in the space charge region. Only a small part of the axial p-n nanowires are a space charge region and therefore only this small area which is limited by the nanowire cross section is effective for charge separation. In addition, the dopants concentration profile is not sharp due to CVD process limitations resulting in a lower built-in potential and low photovoltaic efficiency.

The second photovoltaic nanowire structure demonstrated is based on a coaxial structure p-n junction nanowire [12]. This structure is a core-shell nanowire, where the core is p-type silicon and the shell is n-type silicon. Although this structure has a significant improvement in photovoltaic efficiency due to large effective charge separation area it holds two major disadvantages. While the core of this coaxial nanowire is crystalline silicon the shell is amorphous and has poor electrical properties. A second disadvantages is the registry challenge. Separate electric contacts must be created for the p and n regions in order to use this nanowire as a photovoltaic device. This is achieved by selective etch of the core, applying e-beam lithography making the approach quite limited for large scale array integration.

In order to overcome these challenges and provide a simple solution we will use the MLCD method to form all crystalline, self-registered, p-n nanowire structure (FIG. 8C). The advantages of the proposed approach are based on the large effective charge separation area, single crystalline structure, and self registered p-n nanowire device.

Using MLCD of the Invention for Patterned Doping

MLCD can be used for fabrication of junctions by using predefined patterned doping of substrates. This can be done in a few methods, as an example by the use of stamping-MLCD method to form doped patterned surfaces. First photolithography is used for formation of predefined silicon dioxide stamps. This substrate is then reacted with a precursor to form dopant bearing monolayer on the $SiO_2$ stamps and then used as the donor substrate in the MLCD process. This process is expected to transfer the predefined pattern as doped-undoped areas on the target substrate. Another approach is the use of photo-cleavable precursors. A protective pattern is formed by photolithography on top of a precursor monolayer. Then the substrate is exposed and the unprotected areas are photo-cleaved leaving active precursor only at the protected areas. This patterned substrate is used as the donor substrate in the MLCD process and expected to transfer the predefined doping pattern to the target substrate.

Using MLCD of the Invention for Doping of Photocatalytic Materials

MLCD can be further developed for doping materials other semiconductors such as photocatalytic materials. For example, titanium dioxide band structure can be tuned by codoping with carbon or molybdenum [13]. MLCD can be used together with carbon and molybdenum containing precursor for the purpose of band gap engineering in titanium dioxide.

Materials and Methods

Intrinsic Si wafers were surface activated by the method noted. UV\Ozone cleaning was done for 10 minutes (UVOCS T10X10/OES). Piranha cleaning was done in a sulfuric acid and hydrogen peroxide 3:1 solution for 15 minutes and then in a ammonium hydroxide and hydrogen peroxide in deionized water solution (1:1:5) for 8 minutes during sonication at 60° C. Samples were then rinsed with ethanol and dried in an oven at 115° C. for 10 minutes. Surface activated samples were reacted with a solution of the precursor in mesitylene for 2 hours at 100° C. Reacted samples were rinsed with mesitylene and dichloromethane and blow dried with nitrogen. The reacted substrates were brought to contact with the target substrate inside the RTP chamber (AnnealSYS As-Micro) then anneal under vacuum. For the preparation of MLD samples silicon dioxide was evaporated on the reacted substrates using e-beam evaporator and silicon dioxide pellets (1-5 mm, Kurt J. Lesker) as source material. 4 point probe sheet resistance measurements (Jandel RM3-AR) were used for electrical characterization of the doped samples. In order to obtain dopant concentration profile TOF-SIMS measurements were carried out using 500 eV $O^{2+}$ sputtering beam and 25 keV $Bi1^+$ analysis beam for p-type doped samples. For n-type doped samples 500 eV $Cs^+$ and 25 keV $Bi1^+$ were used as sputtering and analysis beam accordingly.

TABLE 1

List of precursors used for MLCD process

| Abbr. | Molecule | Conc. in mesitylene |
|---|---|---|
| Boron | | |
| TMPBA | 2,4,6-trimethylphenylboronic acid | 4.25 mg/mL |
| NBA1 | naphthalene-1-boronic acid | 0.62 mg/mL |
| NBA2 | 2-naphthylboronic acid | 3.50 mg/mL |
| PBA | phenylboronic acid | 4.25 mg/mL |
| Phosphorus | | |
| DMMP | dimethylmethylphosphonate | 1 v/v % |
| TEMDP | tetraethyl methylenediphosphonate | 1 v/v % |
| DEOPP | diethyl (2-oxopropyl)phosphonate | 1 v/v % |
| TMPO | tri(4-morpholino)phosphine oxide | 2.50 mg/mL |
| TPPO | triphenylphosphine oxide | 12.5 mg/mL |
| TCHPO | tricyclohexylphosphine oxide | 3.33 mg/mL |
| DPPO | diphenylphosphine oxide | 1.42 mL concentrated sol. in 10 mL |

The invention claimed is:

1. A process for modifying surface composition of at least one nanowire surface region of a nanowire with at least one type of foreign atoms, the process comprising:
   obtaining a substrate with a layer of molecular entities comprising foreign atom(s) and/or ions of a first type to be implanted in a nanowire surface;
   layering nanowires on a surface region of said substrate covered with said layer,
   coating said nanowires or a surface region of a second material with a layer of molecular entities comprising foreign atom(s) and/or ions of a second type; and
   bringing into contact said nanowires on the substrate covered with said layer, with the surface region of the second material, under rapid thermal processing (RTP) conditions, to permit doping of the nanowire surface regions with said foreign atoms and/or ions of a first and second type.

2. The process according to claim 1, wherein the nanowire surface regions comprises two or more such regions on a same surface or opposite surfaces of the nanowires.

3. The process according to claim 1, wherein the nanowires and/or second material is layered, coated on, or patterned on an inert substrate.

4. The process according to claim 3, wherein the substrate includes a circuit or device structural elements.

5. The process according to claim 4, wherein the device elements are selected from electrical contacts, wires, conductive paths, conducting elements, optical and/or opto-electrical elements, and other three-dimensional elements.

6. The process according to claim 1, wherein the molecular entities are ligand molecules selected from organic-inorganic hybrid molecules.

7. The process according to claim 6, wherein the molecular entities are in the form of inorganic or organic salts comprising one or more of the foreign atoms in a charged or neutral state.

8. The process according to claim 6, wherein the molecular entities are selected from 2,4,6-trimethylphenylboronic acid (TMPBA), naphthalene-1-boronic acid (NBA1), 2-naphthylboronic acid (NBA2), phenylboronic acid (PBA), dimethylmethylphosphonate (DMMP), tetraethyl methylenediphosphonate (TEMDP), diethyl (2-oxopropyl)phosphonate (DEOPP), tri(4-morpholino)phosphine oxide (TMPO), triphenylphosphine oxide (TPPO), tricyclohexylphosphine oxide (TCHPO), and diphenylphosphine oxide (DPPO).

9. The process according to claim 1, wherein the foreign atoms to be implanted in the material surface region are selected to alter one or more of material electronic properties, increase the concentration of the foreign atom in the material surface, alter one or more of the material's rheological properties, alter one or more of the material's tribological properties, endow the material with a physical or chemical property not previously associated with the material, and modify a physical or chemical property of the material.

10. The process according to claim 1, wherein the foreign atoms are selected from p-type dopants and n-type dopants.

11. The process according to claim 1, wherein the foreign atoms (or ions) are one or more of Li, Mg, Na, K, Rb, Cs, Be, Ca, Sr, Ba, Sc, Ti, V, Cr, Fe, Ni, Cu, Zn, Y, La, Zr, Nb, Tc, Ru, Mo, Rh, W, Au, Pt, Pd, Ag, Co, Cd, Hf, Ta, Re, Os, Ir, Hg, B, Al, Ga, In, TI, C, Si, Ge, Sn, Pb, P, As, Sb, Bi, O, S, Se, Te, Po, F, Cl, Br, I, At, and any combination thereof.

12. The process according to claim 11, wherein the foreign atom is selected from B and P and the molecular entity is selected from 2,4,6-trimethylphenyl boronic acid (TMPBA), naphthalene-1-boronic acid (NBA1), 2-naphthylboronic acid (NBA2), phenylboronic acid (PBA), dimethylmethylphosphonate (DMMP), tetraethyl methylenediphosphonate (TEMDP), diethyl (2-oxopropyl)phosphonate (DEOPP), tri (4-morpholino)phosphine oxide (TMPO), triphenylphosphine oxide (TPPO), tricyclohexyl phosphine oxide (TCHPO), and diphenylphosphine oxide (DPPO).

13. The process according to claim 1, wherein rapid thermal processing (RTP) conditions include one or more of temperature and pressure.

14. The process according to claim 13, wherein RTP conditions are applied for a time period of from less than one second to several minutes.

15. The process according to claim 13, wherein said temperature being within the range of 50° C. to 1,200° C., the conditions optionally include application of vacuum.

16. The process according to claim 1, for ultra-shallow doping of said atoms (ions) to a surface depth extending from the most exposed region of the material external surface to a depth of about 1,000 nm.

17. The process according to claim 16, wherein doping being to a surface depth of between about 1 to about 1,000 nm, from the exposed material surface.

18. The process according to claim 17, wherein the depth is between about 1 to about 30 nm from the exposed material surface.

* * * * *